(12) United States Patent
Kitagawa

(10) Patent No.: US 7,525,778 B2
(45) Date of Patent: Apr. 28, 2009

(54) SEMICONDUCTOR INTEGRATED CIRCUIT HAVING PROTECTION ELEMENTS FOR PREVENTING MOS TRANSISTORS FROM PLASMA DAMAGE

(75) Inventor: Nobutaka Kitagawa, Tokyo (JP)

(73) Assignee: Kabushiki Kaisha Toshiba (JP)

( * ) Notice: Subject to any disclaimer, the term of this patent is extended or adjusted under 35 U.S.C. 154(b) by 501 days.

(21) Appl. No.: 10/982,431

(22) Filed: Nov. 4, 2004

(65) Prior Publication Data

US 2005/0111153 A1    May 26, 2005

(30) Foreign Application Priority Data

Nov. 6, 2003   (JP)   ............... 2003-377288

(51) Int. Cl.
*H02H 3/22*   (2006.01)
(52) U.S. Cl. .................................... 361/56; 361/111
(58) Field of Classification Search ............. 361/56–58, 361/91.1, 111; 330/261, 298; 257/360–365
See application file for complete search history.

(56) References Cited

U.S. PATENT DOCUMENTS

| | | | | |
|---|---|---|---|---|
| 4,314,268 | A * | 2/1982 | Yoshioka et al. ............ | 257/503 |
| 4,654,549 | A * | 3/1987 | Hannington .................. | 326/78 |
| 4,698,527 | A * | 10/1987 | Matsumoto ................... | 326/78 |
| 4,972,159 | A * | 11/1990 | Nakatoh et al. ............. | 330/261 |
| 6,091,114 | A | 7/2000 | Mogul et al. | |
| 6,172,383 | B1 * | 1/2001 | Williams ..................... | 257/173 |
| 6,249,410 | B1 * | 6/2001 | Ker et al. .................... | 361/56 |

(Continued)

FOREIGN PATENT DOCUMENTS

JP    59-50559    3/1984

(Continued)

OTHER PUBLICATIONS

Notification of Reasons for Refusal dispatched on Apr. 4, 2008 by the Japanese Patent Office corresponding to the related Japanese Patent Application No. 2003-377288.

*Primary Examiner*—Michael Sherry
*Assistant Examiner*—Danny Nguyen
(74) *Attorney, Agent, or Firm*—DLA Piper US LLP

(57) ABSTRACT

A semiconductor integrated circuit having protection elements for protecting a MOSFET of a high accuracy analog circuit from plasma damage generated during a manufacture of the semiconductor integrated circuit is provided. The protection elements operate at a lower voltage of PN junction breakdown voltage so as to prevent transistors from degrading or having dielectric breakdown due to plasma damage. A differential amplifier includes first and second n-channel MOS transistors for constructing a differential input pair. A first protection element comprising a plurality of gate-drain connected MOS transistors coupled as a cascade is provided between the gate of the first n-channel MOS transistor and a first differential input terminal. A second protection element comprising a plurality of gate-drain connected MOS transistors coupled as a cascade is provided between the gate of the second n-channel MOS transistor and a second differential input terminal. Each of the first and second protection elements operates at a lower voltage of PN junction breakdown voltage.

11 Claims, 11 Drawing Sheets

U.S. PATENT DOCUMENTS

| | | | |
|---|---|---|---|
| 6,294,941 B1 * | 9/2001 | Yokosawa | 327/309 |
| 6,404,275 B1 * | 6/2002 | Voldman et al. | 327/538 |
| 6,456,474 B2 * | 9/2002 | Yasumori | 361/91.5 |
| 6,483,386 B1 * | 11/2002 | Cress et al. | 330/298 |
| 6,537,868 B1 * | 3/2003 | Yu | 438/237 |
| 6,713,817 B2 * | 3/2004 | Kitagawa et al. | 257/360 |
| 2003/0026052 A1 * | 2/2003 | Spehar et al. | 361/56 |

FOREIGN PATENT DOCUMENTS

| | | |
|---|---|---|
| JP | 3-190307 | 8/1991 |
| JP | 8-172188 | 7/1996 |
| JP | 2002-141421 | 5/2002 |

* cited by examiner

SEMICONDUCTOR INTEGRATED CIRCUIT HAVING PROTECTION ELEMENTS FOR PREVENTING MOS TRANSISTORS FROM PLASMA DAMAGE

CROSS-REFERENCE TO RELATED APPLICATIONS

This application claims priority from, and the benefit of, Japanese Patent Application No. 2003-377288, filed on Nov. 6, 2003, the contents of which are expressly incorporated herein by reference in their entirety.

BACKGROUND OF THE INVENTION

1. Field of the Invention

The present invention relates to a semiconductor integrated circuit for a high accuracy analog circuit, and more particularly, to a semiconductor integrated circuit having protection elements for protecting MOS transistors in the high accuracy analog circuit from plasma damage occurring during the manufacturing processes of the semiconductor integrated circuit.

2. Description of the Related Art

Recent semiconductor technologies have rapidly promoted thin filming of semiconductor integrated circuits. Particularly, in MOS (Metal Oxide Semiconductor) type semiconductor integrated circuits or CMOS (Complementary MOS) type semiconductor integrated circuits technologies, thin filming for a thickness of gate insulating film has rapidly developed together with rapid developments of fining for a size or a length of the gate.

Generally, plasma processes, such as plasma etching, sputtering or plasma chemical vapor deposition (CVD), are used during manufacturing of MOS or CMOS type semiconductor integrated circuits. In the plasma process, electric charges are generated and concentrated on a gate electrode due to a charge-up phenomenon. The concentrated charge is supplied to a gate insulating film that is provided under a gate electrode, as a surge voltage. This generates various defects of the gate insulating film, such as degradations due to an increase of density of a surface level or dielectric breakdown.

When the plasma damage occurs at a gate insulating film, element characteristics of the gate insulating film have fluctuated or broken down. Thus, such a semiconductor integrated circuit may not be used because it has been lost reliability. In particular, a tolerance for the fluctuation of the element characteristic is much more severe for a MOS analog circuit than a MOS digital circuit, because the MOS analog circuit may use pairing or analogousness of elements. For instance, if a pairing ($\Delta V_{th}$) of a threshold voltages ($V_{th}$) of a semiconductor integrated circuit fluctuates more than several milli-volts (mV), it may not be used as a MOS analog circuit, because the pairing of threshold voltages is an important characteristic for a MOS analog circuit.

To avoid plasma damage during manufacturing processes, a semiconductor integrated circuit having a protection element have conventionally been proposed. The inventor also has proposed such a semiconductor integrated circuit having protection element for avoiding plasma damage. FIG. 10 illustrates a circuit diagram of a semiconductor integrated circuit 110 for an operational amplifier proposed in a previous application by the same inventor.

As illustrated in FIG. 10, the semiconductor integrated circuit 110 comprises a group of MOS type transistors TR101, TR102 of the same characteristics and wiring films 111. Although the group includes more than two MOS type transistors, for simplification of explanation, this instance shows two MOS type transistors TR101 and TR102. To prevent the transistor characteristics from fluctuating influences due to the plasma damage, each gate electrode of the MOS transistor TR101, TR102 is respectively provided a damage relieving circuit of two diodes 103-104 and 101-102 between a supply voltage Vcc and a ground 119.

Recently, integration technologies for a large scale integrated circuit (LSI) of MOS type or CMOS type have advanced thin filming of a gate insulating film. Thus, an insulation breakdown voltage of a gate insulating film also has rapidly dropped. Consequently, a relationship between an insulation breakdown voltage of a gate insulating film and a breakdown voltage of a protection diode in a reverse direction has been changed. FIG. 11 that has been described in an article "ESD in Silicon Integrated Circuits" issued by John Wiley & Sons in 1995 shows a relationship between a PN junction breakdown voltage depending upon a thickness of a gate film and a gate insulating breakdown voltage depending upon a thickness of a gate film.

In FIG. 11, a solid line (a) indicates a PN junction breakdown voltage depending upon a thickness of a gate film, i.e., a PN junction breakdown voltage between a source/drain layer of a MOS transistor and a substrate. A dotted line (b) indicates a gate insulation breakdown voltage depending upon a thickness of the gate insulating film. As shown in FIG. 11, even when a thickness of a gate film is reduced, a reduction of a PN junction breakdown voltage is not lowered very much. On the contrary, a gate insulation breakdown voltage rapidly falls even when a thickness of a gate film is gradually reduced. When the thickness of a gate film is reduced lower than 3.8 nano-meters (nm), the relationship between the gate breakdown voltage and the PN junction breakdown voltage is reversed. Thus, the PN junction breakdown voltage becomes higher than the gate insulation break down voltage. This generates such a defect that a gate insulation breakdown occurs prior to an occurrence of a break-down of the protection diodes due to plasma damage during a manufacture of MOS or CMOS.

Accordingly, when a thin filming of a gate layer thickness has been promoted, the conventional MOS or CMOS gate protection techniques have defects and problems that a gate insulating film has broken down before protection elements are broken down by plasma damage during manufacturing processes of the semiconductor integrated circuit.

SUMMARY OF THE INVENTION

Accordingly, an embodiment in accordance with the present invention provides a semiconductor integrated circuit, comprising: an input terminal; a transistor configured to conduct in response to an input signal being supplied to the input terminal; and a protection element coupled between a gate of the transistor and a ground or between the gate of the transistor and a power source line so as to discharge plus or minus charges generated during manufacturing processes of the semiconductor integrated circuit into the ground or the power source line by operating at a lower voltage than a PN junction breakdown voltage.

A further embodiment in accordance with the present invention relates to a semiconductor integrated circuit, comprising first and second input terminals; a first transistor configured to conduct in response to a first input signal being supplied to a gate of the first transistor through the first input terminal; a second transistor configured to conduct in response to a second input being supplied to a gate of the second transistor signal through the second input terminal; a first protection element coupled between a gate of the first transistor and the ground or between a gate of the first transistor and a power source line so as to discharge minus or plus charge generated during manufacturing of the semiconductor integrated circuit to the ground or the power source line by operating at a lower voltage than a PN junction breakdown voltage; and a second protection element coupled between a gate of the second transistor and the ground or between a gate of the second transistor and a power source line so as to discharge minus or plus charge generated during manufacturing of the semiconductor integrated circuit to the ground or the source line by operating at a lower voltage than a PN junction breakdown voltage.

BRIEF DESCRIPTION OF THE DRAWINGS

The accompanying drawings, which are incorporated in and constitute part of this specification, illustrate various embodiments and/or features of the invention, and together with the description, serve to explain the invention. Where possible, the same reference numbers are used throughout the drawings to describe the same or like parts.

DESCRIPTION OF THE EMBODIMENTS

Figure 1:
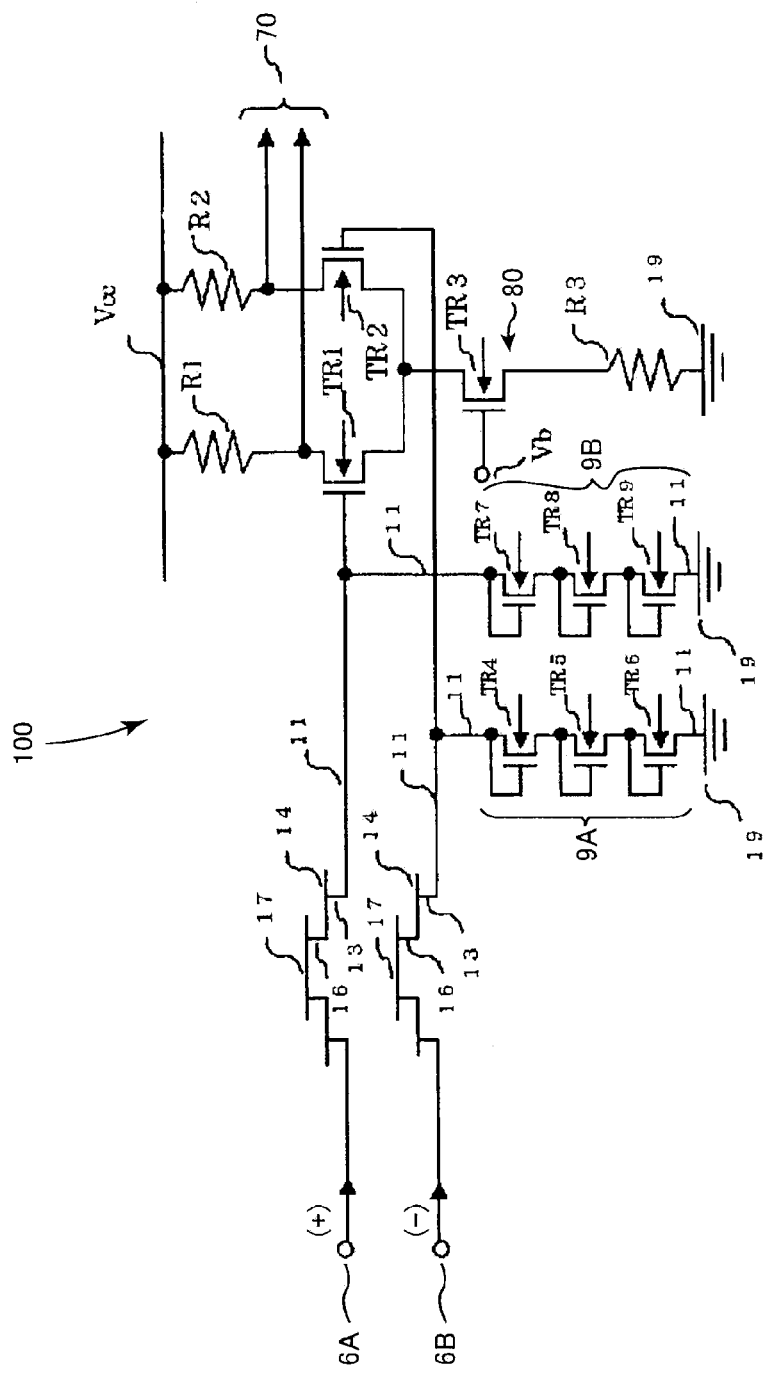
FIG. 1 is a circuit diagram of an exemplary differential amplifier as a semiconductor integrated circuit in accordance with an embodiment of the present invention.

Reference is now made in detail to the exemplary embodiments in accordance with the present invention, examples of which are illustrated in the accompanying drawings. FIG. 1 is a circuit diagram of an exemplary differential amplifier as a high accuracy analog semiconductor circuit in accordance with the present invention. In this embodiment, a differential amplifier 100 includes a plurality of N channel MOS transistors (hereinafter, simply referred to as "Nch MOS transistor)" in a silicon substrate.

As illustrated in FIG. 1, a differential amplifier 100 includes a differential input pair 50 comprising first and second Nch MOS transistors TR1 and TR2. The gates of the Nch MOS transistors TR1 and TR2 are coupled to a first input terminal 6A and a second input terminal 6B, respectively. In this embodiment, it is supposed that the first input terminal 6A inputs plus (+) charges and the second input terminal 6B inputs minus (−) charges. The drains of the first and second Nch MOS transistors TR1 and TR2 of the differential input pair 50 are commonly coupled to a power source line Vcc though first and second resistors R1 and R2, respectively. The sources of the first and second Nch MOS transistors TR1 and TR2 are commonly connected and also coupled to the ground potential 19 through a bias unit 80 that comprises a third Nch MOS transistor TR3 and a third resistor R3 that are coupled in series. Thus, the sources of the first and second MOS transistors TR1 and TR2 are commonly coupled to the ground 19 through the bias unit 80. A bias potential Vb is supplied to a gate of the third Nch MOS transistor TR3. The bias voltage Vb controls on and off operation of the third transistor TR3.

Further, the differential amplifier 100 includes first and second protection units 9A and 9B coupled to the differential input pair 50, respectively. Thus, the first protection unit 9A is coupled in series between the gate of the first Nch MOS transistor TR1 and the ground 19. The second protection unit 9B is coupled in series between the gate of the second Nch MOS transistor TR2 and the ground 19. Each of the protection units 9A and 9B comprises a plurality of gate-drain connected Nch MOS transistors coupled in series. In this embodiment, the first protection unit 9A comprises three stages of gate-drain connected Nch MOS transistors TR7-TR9 that are coupled in series between the gate of the first Nch MOS transistor TR1 and the ground 19. The second protection element 91B comprises three stages of gate-drain connected Nch MOS transistors TR4-TR6 that are coupled in series between the gate of the second Nch MOS transistor TR1 and the ground 19.

A wiring layer coupled between the first Nch MOS transistors TR1 and the first input terminal 6A includes a first wiring layer 11, a first via 13 coupled to the first wiring layer 11, a second wiring layer 14 coupled to the first layer 11 through the first via 13, a second via 16 coupled to the second wiring layer 14 and a third wiring layer 17 coupled to the first wiring layer 11 through the first and second vias 13 and 14. A wiring layer coupled between each gate of the first and second Nch MOS transistors TR1 and TR2 and the ground 19 also comprises the first wiring layer 11.

To construct a differential pair, when one plus signal is supplied to the first input terminal 6A, and a converted minus signal is supplied to the second input terminal 6B. The plurality of gate-drain connected Nch MOS transistors TR7-TR9 of the first protection unit 9A operates as a protection element for the first Nch MOS transistor TR1 of the differential pair. Similarly, the plurality of gate-drain connected Nch MOS transistors TR4-TR6 of the second protection unit 9B operates as a protection element for the second Nch MOS transistor TR2 of the differential pair. Each of the plurality of gate-drain connected Nch MOS transistors of the first and second protection units 9A and 9B may conduct at a lower threshold voltage (Vth) than a reverse direction PN junction breakdown voltage of a diode. When the bias voltage Vb turns ON the third transistor TR3, the first and second Nch MOS transistors TR1 and TR2 are conducted by the signals supplied from the differential first and second input terminals 6A and 6B. In accordance with the differential inputs, the differential amplifying circuit 100 provides an amplified differential signal as an output signal 70. Outputting points for the output signal 70 are provided between each drain of the first and second Nch MOS transistor TR1 and TR2 and the first and second resistors R1 and R2, respectively.

Figure 2:
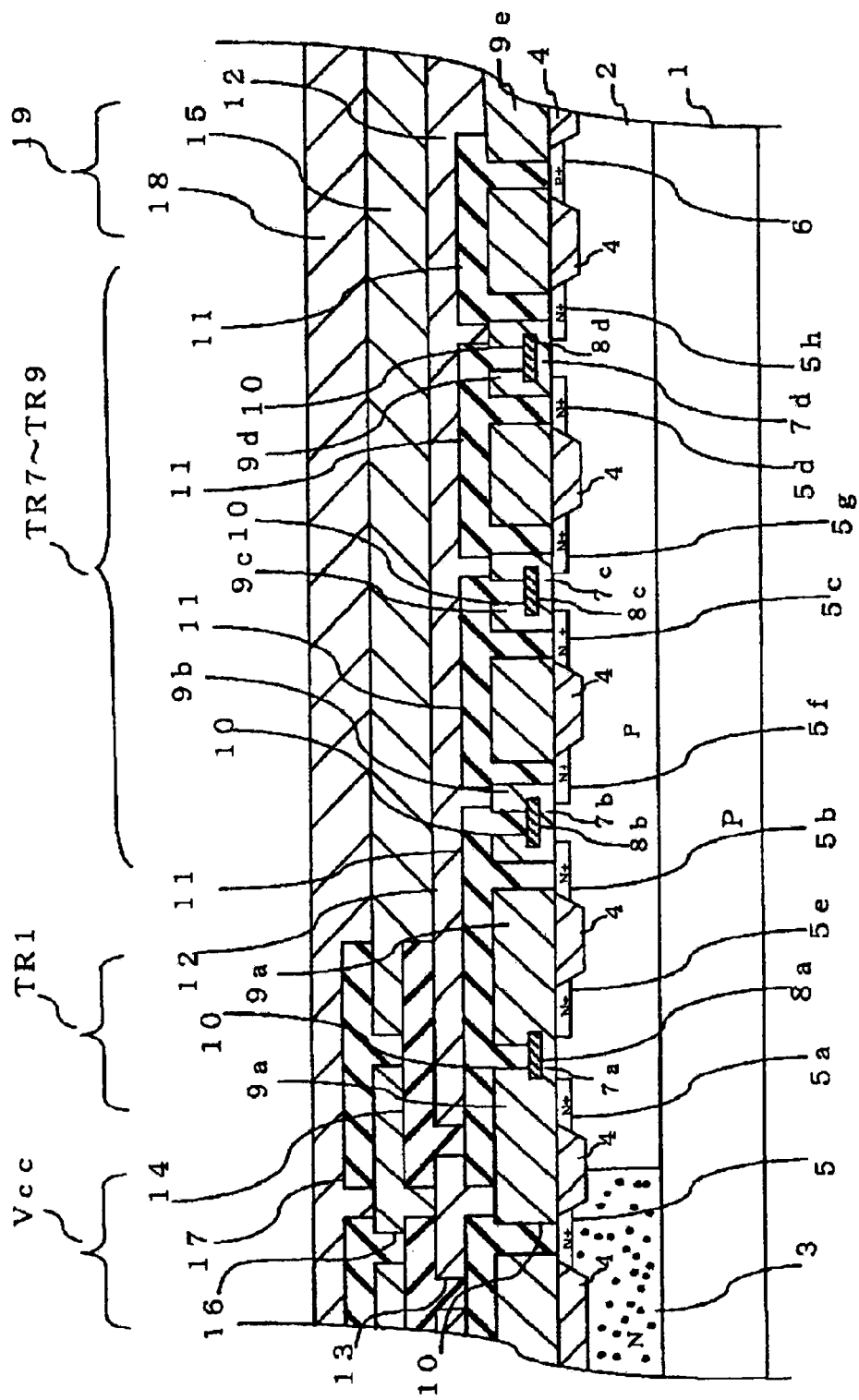
FIG. 2 is a cross-sectional view illustrating an embodiment of the differential amplifier shown in FIG. 1.

FIG. 2 illustrates a cross-sectional view of the first Nch MOS transistor TR1 and the first protection unit 9A that comprises three gate-drain connected Nch MOS transistors TR7-TR9. The differential amplifying circuit 100 includes the second Nch MOS transistor TR2 and the second protection unit 9B that comprises gate-drain connected Nch MOS transistors TR4-TR6 that have substantially the same configuration to the first configuration. To simply the explanation, the second configuration is omitted in the drawing. In this embodiment, the differential amplifier is constructed by a P type silicon substrate 1, and a P well region 2 and an N well region 3 provided on the P type silicon substrate 1. The first Nch MOS transistor TR1 and the first protection unit 9A comprising the three gate-drain connected Nch MOS transistors TR7-TR9 are formed in the P well region 2.

The first Nch MOS transistor TR1 and the three gate-drain connected Nch MOS transistors TR7-TR9 are constructed by forming a plurality of $N^+$ drain regions 5a-5d and a plurality of $N^+$ source regions 5e-5h on the P well region 2. The transistors TR1 and TR7-TR9 are separated by a respective one of a plurality of embedded insulating regions 4. Each of the first Nch MOS transistor TR1 and the plurality of gate-drain connected Nch MOS transistors TR7-TR9 is formed by providing a plurality of $N^+$ drain regions 5a-5d and a plurality of $N^+$ source regions 5e-5h on the P well region 2. The $N^+$ source region 5h of the gate-drain connected Nch MOS transistor TR9 is coupled to a $P^+$ region 6 through the first wiring layer 11 that has a substrate potential. The $P^+$ region 6 is used as the ground 19 for the differential amplifying circuit 100. The $N^+$ region 5 formed on the surface of N well region 3 is separated by the embedded insulating region 4 for use as the power source Vcc for the differential amplifying circuit 100.

In a channel area between the drain $N^+$ region 5a and the source $N^+$ region 5e, a gate insulating film 7a and a gate electrode 8a are formed by a silicon oxicided region that is formed under a high-temperature oxidation. Similarly, a gate insulating film 7b and a gate electrode 8b are formed in a channel area between the drain $N^+$ region 5b and the source $N^+$ region 5f of the gate-drain connected Nch MOS transistor TR7. Further, a gate insulating film 7c and a gate electrode 8c are formed in a channel area covering from the drain $N^+$ region 5c to the source $N^+$ region 5g of the gate-drain connected Nch MOS transistor TR8. A gate insulating film 7d and a gate electrode 8d are formed in a channel area covering from the drain $N^+$ region 5d to the source $N^+$ region 5h of the gate-drain connected Nch MOS transistor TR9.

In this embodiment, each of the gate insulating films 7a-7d is made of a silicon oxide film. Of course, it is possible to use other types of film for each of the gate insulating films 7a-7d, such as a SiNxOy film that is obtained by heat nitriding a silicon oxide film or a stacked film of a silicon nitride film ($Si_3N_4$) and a silicon oxide film. Each of a plurality of openings 10 for the power source Vcc, the ground 19, and the Nch MOS transistor TR1 and the gate-drain connected Nch MOS transistors TR7-TR9 are formed so as to expose a portion of surfaces of the $N^+$ region 5, the $N^+$ drain regions 5a-5d, the $N^+$ source regions 5e-5h, the $P^+$ regions 6 and the gate electrodes 8a-8d by selectively plasma etching the insulating regions 9a-9e.

Each group of the exposed $N^+$ drain region 5b and gate electrode 8b, $N^+$ drain region 5c and gate electrode 8c $N^+$ drain region 5d and gate electrode 8d of gate-drain connected Nch MOS transistors TR7-TR9 is coupled through the first wiring 11. Further, the exposed $N^+$ source region 5f of the gate-drain connected Nch MOS transistor TR7, the exposed $N^+$ drain region 5c of the gate-drain connected Nch MOS transistor TR8 and the gate electrode 8c are coupled through the first wiring 11. The exposed $N^+$ source region 5g of gate-drain connected Nch MOS transistor TR8, exposed $N^+$ drain region 5d of gate-drain connected Nch MOS transistor TR9 and gate electrode 8d are coupled through the first wiring 11. The exposed $N^+$ source region 5h of the gate-drain connected Nch MOS transistor TR9 and $P^+$ region 6 of a substrate potential are coupled through the first wiring 11.

As shown in FIG. 1, the first wiring 11 is coupled between a gate of the Nch MOS transistor TR1 and a plus input terminal 6A. Similarly, the first wiring 11 is coupled between a gate electrode of the Nch MOS transistor TR2 and a minus input terminal 6B. Further, the first wiring 11 connects between a gate and a drain of each of the gate-drain connected Nch MOS transistors TR4-TR6 and TR7-TR9. A source of the gate-drain connected Nch MOS transistor TR6 and the ground 19, the source of gate-drain connected Nch MOS transistor TR9 and the ground 19 are also coupled through the first wiring 11.

As illustrated in FIG. 2, the first wiring 11 is coupled to a third wiring 17 through a first via 13, a second wiring 14 and a second via 16. The wiring layer 11 for differential input terminal 6A is not shown in FIG. 2. The first wiring layer 11 adjoins to a base substrate of the integrated circuit. The second wiring layer 14 is a stacked wiring region on the first wiring 11. The second wiring 14 is formed on a first inter-insulating region 12 and is coupled to the first wiring 11 through first via 13. The third wiring 17 is formed on a second inter-insulating region 15. Further, it is coupled to the second wiring 14 through a second via 16. A protective region 18 is formed on the third wiring. The first, second and third wirings 11, 14 and 17 are respectively made of a metal, such as an Al (aluminum) or a copper (Cu). Though three wirings 11-17 are provided in this embodiment, of course, it is possible to provide a fourth wiring through a third via.

In this embodiment, two protection elements 6A and 6B are respectively provided for protecting Nch MOS transistors TR1 and TR2 from damage due to charges generated during manufacturing processes by connecting between each gate of the Nch MOS transistors TR1 and TR2 and the ground as a cascade, respectively. Further, each of the protection elements 6A and 6B is configured so as to turn ON at a threshold voltage (Vth) that is lower than a reverse direction PN junction breakdown voltage of a diode. Consequently, it becomes possible to discharge both plus (+) and minus (−) charges that are generated during the multi wiring processes to the ground through the respective protection elements 6A and 6B at a lower voltage that is lower than the reverse direction PN junction breakdown voltage of a diode. The plus (+) and minus (−) charges are generated during the multi wiring processes, such as, in particular a plasma etching opening process under the reactive ion etching (R1E) for a via or a reverse sputtering process for wiring metals. The charges are mainly generated due to a spatial non-uniformity of plasma charge up in a wafer surface during plasma processes, such as an R1E, a sputtering or plasma CVD.

For example, if a minus charge is generated during plasma process, a PN junction between the $N^+$ drain region 5b of gate-drain connected Nch MOS transistor TR7 and a P well region 2 becomes biased in a forward direction in order for the minus charge on the silicon substrate 1 to be at a lower voltage of at least less than 0.6V of a diode. Similarly, a PN junction between the $N^+$ drain region (not shown) of the gate-drain connected Nch MOS transistor TR4 and the P well region 2 becomes biased in a forward direction and it becomes possible to discharge the minus charge to the P type silicon substrate 1. If plus (+) charges are generated, a threshold voltage (Vth) is sequentially supplied to each of the gate-drain connected transistors TR7-TR9 of the first protection element A and all transistors TR7-TR9 are in an "ON" state. Consequently, it becomes possible to discharge the plus charge to the P type silicon substrate 1 at a lower voltage than a reverse direction PN junction breakdown voltage of a diode. Similarly, the protection unit 6B protects the Nch MOS transistor TR2 by discharging the generated charges to the ground.

Accordingly, the embodiment in accordance with this invention may prevent the gate insulating films 7a-7d from degrading or having a dielectric breakdown due to the plus (+) or minus (−) charges. Further, it becomes possible to reduce degradation or dielectric breakdown of gate insulating films 7a-7d by reducing a first antenna ratio of a via opening area to an area of each gate insulating films 7a-7d, or a second antenna ratio of an wiring area to an area of gate insulating films 7a-7d. Since it becomes possible to reduce the charges by reducing the antenna effect of charges generated during manufacturing processes.

Next, relationships among a maximum voltage (Vsmax) of an input signal supplied to each gate of Nch MOS transistors TR1 and TR2, a total threshold voltage (Vtht) of the protection units and a PN junction breakdown voltage (Vbk) between an N+ film 5 and a P well film 2 are considered. The total threshold voltage (Vtht) is represented by equation (1).

$$Vtht = N \times Vth \quad (1)$$

Here, Vth is a threshold voltage; N is a number of cascade connections for the gate-drain connected Nch MOS transistors TR4-TR6 or TR7-TR9. In this embodiment, N=3. A relationship among a maximum voltage (Vsmax), a total threshold voltage (Vtht) and a PN junction breakdown voltage (Vbk) is represented by equation (2).

$$0 < Vsmax < Vtht < Vbk \quad (2)$$

As apparent from equations (1) and (2), the total threshold voltage (Vtht) is determined by a number N of cascade connections of gate-drain connected Nch MOS transistor groups TR4-TR6 or TR7-TR9. And the total threshold voltage (Vtht) may satisfy conditions to be at a lower voltage than a PN junction breakdown voltage (Vbk) and a higher voltage than a maximum voltage (Vsmax). Of course, it is desired for the total threshold voltage (Vtht) to be set lower than a gate breakdown voltage of Nch MOS transistors TR1 and TR2.

As explained above, a semiconductor integrated circuit according to this embodiment in accordance with the present invention includes a protection unit 6A that comprises a plurality of gate-drain connected Nch MOS transistors TR7-TR9 coupled as a cascade between a differential input gate of one Nch MOS transistor TR1 for the amplifying circuit 100 and the ground 19. Similarly, a protection unit 6B comprising a plurality of gate-drain connected Nch MOS transistors TR4-TR6 is coupled between a gate of other Nch MOS transistor TR2 of a differential input and the ground 19. The first wiring layer 11 couples all of the MOS transistors.

Since the charges generated during a plasma process for manufacturing multi wiring layers are released to the ground 19 through a cascade connection of a plurality of gate-drain connected Nch MOS transistors TR4-TR6 and TR7-TR9, it becomes possible to prevent gate insulating films of Nch MOS transistors TR1 and TR2 from receiving degradations or dielectric breakdowns. Consequently, it becomes possible to restrain occurrences of characteristic degradation of and reliability for a differential amplifying circuit 100 using Nch MOS transistors TR1 and TR2.

Figure 3:
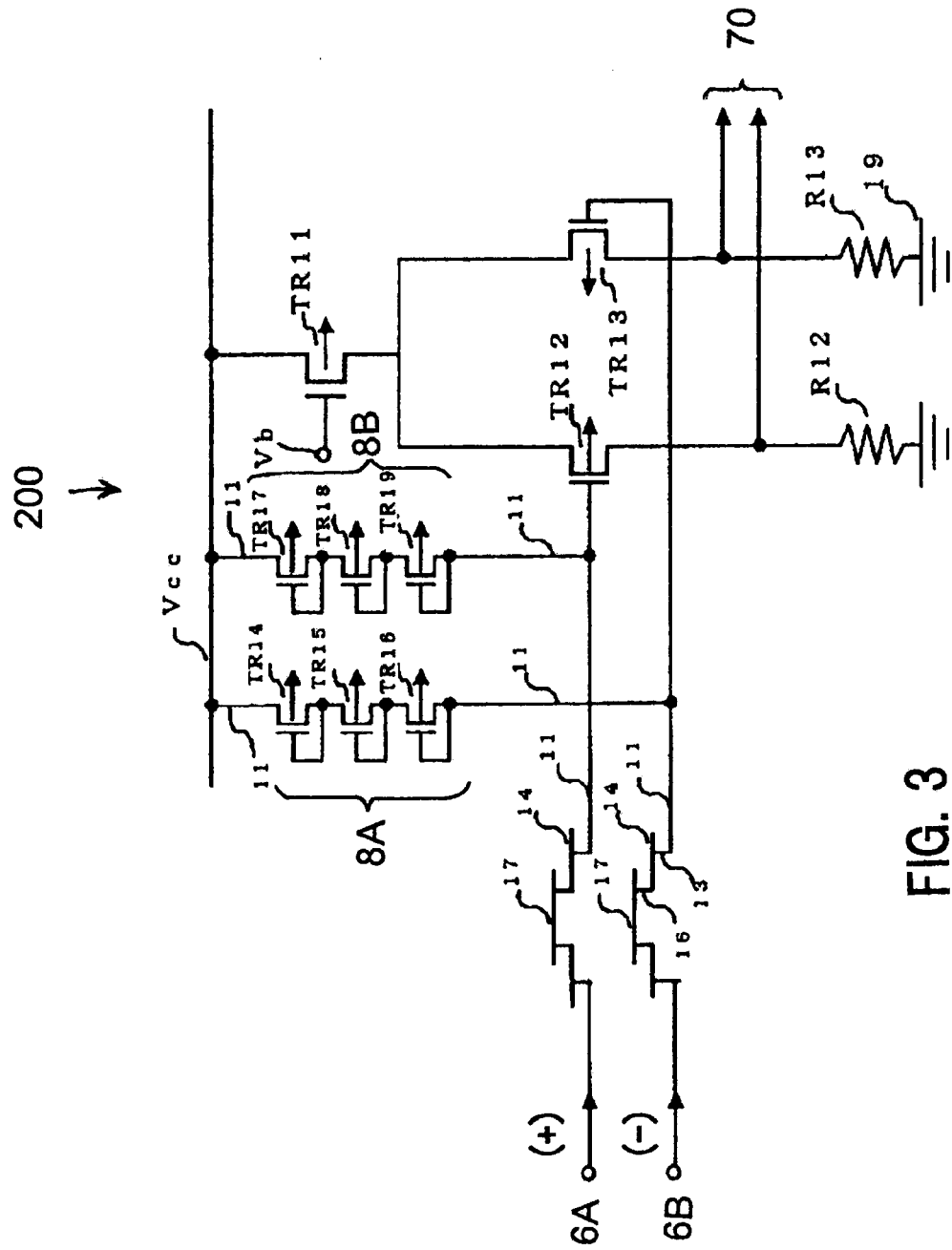
FIG. 3 is a circuit diagram of another embodiment of a differential amplifier in accordance with the present invention.

FIG. 3 is a circuit diagram of another embodiment of a differential amplifying circuit in accordance with the present invention. The same numbers are used for eliminating the same explanation as to the same parts of the embodiment shown in FIG. 1. The differential amplifying circuit 200 comprises two Pch MOS transistors TR12 and TR13 that construct a differential input pair. Further, a Pch MOS transistor TR11 is commonly provided between the power source Vcc and commonly connected drains of the Pch MOS transistors TR12 and TR13. The differential amplifying circuit 200 further includes a resistor R12 provided between a drain of the Pch MOS transistor TR12 and the ground 19, a resistor R13 provided between a drain of the Pch MOS transistor TR13 and the ground 19, a first protection unit 8B comprising a plurality of gate-drain connected Pch MOS transistors TR17-TR19 provided between a gate of the Pch MOS transistor TR12 and a power source Vcc, and a second protection unit 8A comprising a plurality of gate-drain connected Pch MOS transistors TR14-TR16 between a gate of the Pch MOS transistor TR13 and the power source Vcc.

A gate of the Pch MOS transistor TR12 is coupled to a differential input (+) terminal 6A through a first wiring layer 11. A drain of the gate-drain connected Pch MOS transistor TR19 and the input 6A also is coupled by the first wiring layer 11. Each gate and drain of the plurality of gate-drain connected Pch MOS transistors TR17-TR19 is coupled through the first wiring layer 11. The layer 11 also couples the power source Vcc and a source of gate-drain connected Pch MOS transistor TR17. Similarly, the first wiring layer 11 is coupled between a gate of Pch MOS transistor TR13 and a differential (−) input terminal 6B, between the input terminal 6B and a drain of gate-drain connected Pch MOS transistor TR16, between each gate and drain of gate-drain connected Pch MOS transistors TR14-TR16, and between the power source Vcc and source of gate-drain connected Pch MOS transistor TR14.

Similar to the embodiment described in FIG. 1, a wiring layer between each gate of the Pch MOS transistors TR12 and TR13 and a pair of differential input terminals 6A and 6B is coupled through a first wiring layer 11, a first via 13, a second wiring layer 14, a second via 16 and a third wiring layer 17. Each group of the gate-drain connected Pch MOS transistors TR17-TR19 and TR14-TR16 operates as a protection element for each of the Pch MOS transistors TR12 and TR13. The Pch MOS transistor TR11 switches ON or OFF in response to an input of a bias voltage Vb to the gate of the transistor TR11.

Using a plurality of gate-drain connected Pch MOS transistors TR17-TR19 and TR14-TR16 coupled as a cascade, it becomes possible to prevent gate insulating films from degrading or having dielectric breakdown due to charges generated during multi-film wiring processes, in particular, a plasma etching opening process of a via by the R1E and reverse sputtering processes of wiring metals.

If minus charge (−) is generated during the plasma process, a threshold voltage (Vth) is supplied to each of the gate and drain of the Pch MOS transistors TR11 and TR17-TR19 so that the gate-drain connected Pch MOS transistor groups TR14-TR16 and TR17-TR19 are sequentially changed to "ON" state in order to discharge the generated minus charge to an N type silicon substrate on which a power source Vcc is provided. On the contrary, if plus charge (+) is generated, a PN junction between the P+ source region and the N type silicon substrate that constructs the gate-drain connected Pch MOS transistors TR16 and TR19 becomes biased in a forward direction. Thus, it operates so as to discharge the plus charge to the N type silicon substrate on which a power source Vcc is provided. Accordingly, the differential amplifying circuit 200 using Pch MOS transistors TR12 and TR13 also restrains characteristic degradation and reduction of reliability.

Figure 4:
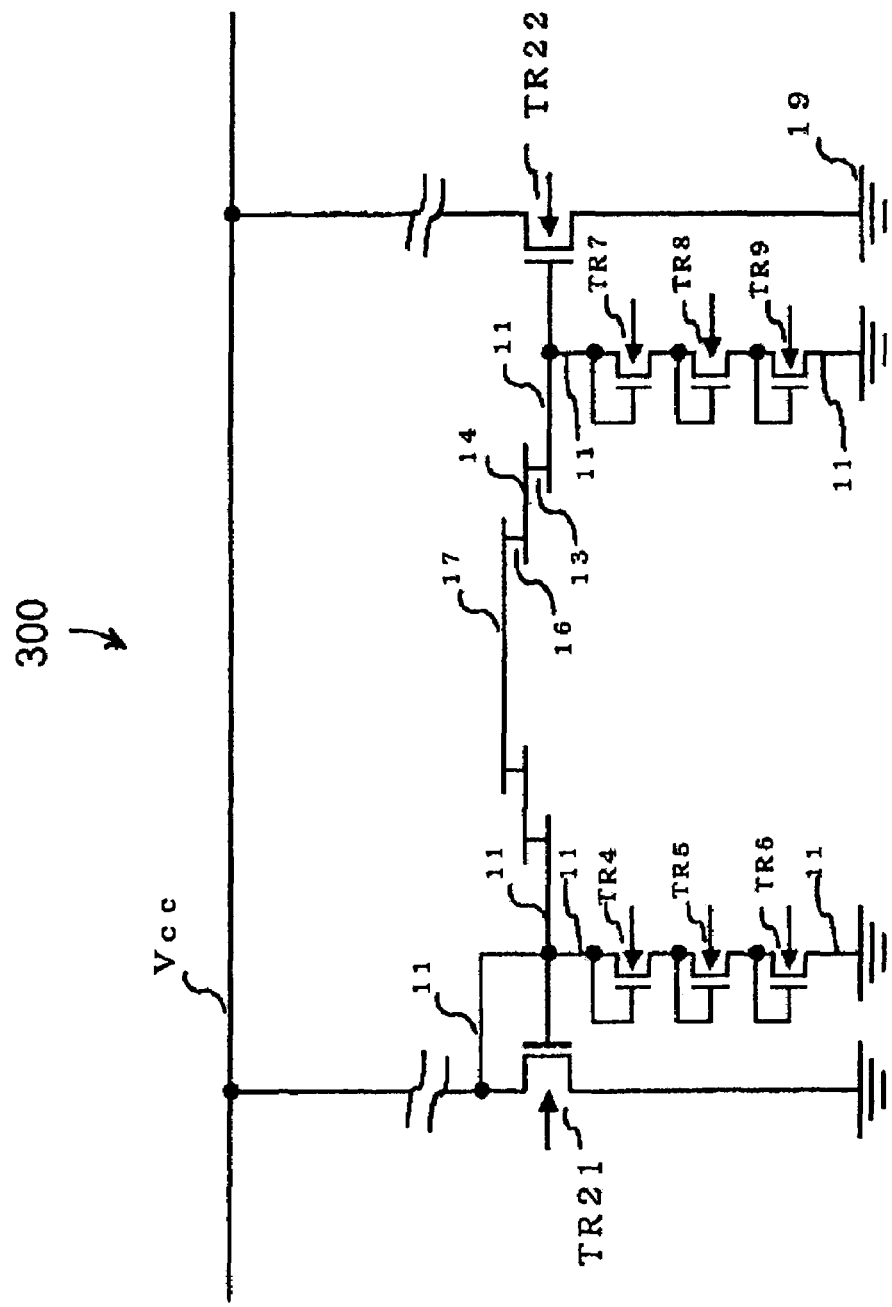
FIG. 4 is a circuit diagram illustrating a current mirror constant current circuit in accordance with an embodiment of the present invention.

In FIG. 4, a circuit configuration of a current mirror constant current circuit 300 constructed by two Nch MOS transistors is depicted as another embodiment of a semiconductor integrated circuit in accordance with the present invention. The Nch MOS transistor uses a silicon substrate. The gate of the Nch MOS transistors TR21 and TR22 are commonly coupled. Similarly to the embodiment shown in FIG. 1, a first plurality of gate-drain connected Nch MOS transistors TR4-TR6 is coupled as a cascade between a gate of the Nch MOS transistor TR21 and the ground 19. Also, a second plurality of gate-drain connected Nch MOS transistors TR7-TR9 is coupled as a cascade between a gate of the Nch MOS transistor TR22 and the ground 19.

A first wiring layer 11 is coupled between the gate and the drain of the Nch MOS transistor TR21. Each drain of Nch MOS transistors TR21 and TR22 is coupled to the power source Vcc. The sources of Nch MOS transistors TR21 and TR22 are coupled to the ground 19. When a reference current flows in the Nch MOS transistor TR21, the Nch MOS transistor TR22 operates so as to output a current that is determined by each ratio of the gate length (Lg) and the gate width (Wg) of the respective Nch MOS transistors TR21 and TR22. The first wiring layer 11 is coupled between each source of gate-drain connected Nch MOS transistors TR6 and TR9 and the ground. The wiring layer 11 also is coupled between the gate of the Nch MOS transistors TR21 and TR22 and the drain of the gate-drain connected Nch MOS transistors TR4 and TR7, respectively. Each first wiring layer 11 connected to each gate of Nch MOS transistors TR21 and TR22 is coupled through a first via 13, a second wiring layer 14, a second via 16, and a third wiring layer 17. Each group of the gate-drain connected Nch MOS transistor TR4-TR6 and TR7-TR9 operates as a protection element for each of the Nch MOS transistors TR21 and TR22.

In this embodiment, if minus (−) charge is generated during a manufacturing process, e.g., a plasma process, each PN junction of gate-drain connected Nch MOS transistors TR4 and TR7 in each the protection elements becomes biased in a forward direction so as to discharge the minus charge to the ground 19. On the contrary, if plus charge (+) is generated during manufacturing processes, a threshold voltage (Vth) is sequentially supplied to both the gate and the drain of the gate-drain connected Nch MOS transistors TR4-TR6 and TR7-TR9 in the protection elements. Thus, each group of the Nch MOS transistors TR4-TR6 and TR7-TR9 is respectively changed and discharges the plus charge the ground. Accordingly, it becomes possible to prevent gate insulating films from degrading or having dielectric breakdown due to charges generated during multi-region wiring processes, in particular, a plasma etching opening process of a via by the R1E and reverse sputtering processes of wiring metals.

Figure 5:
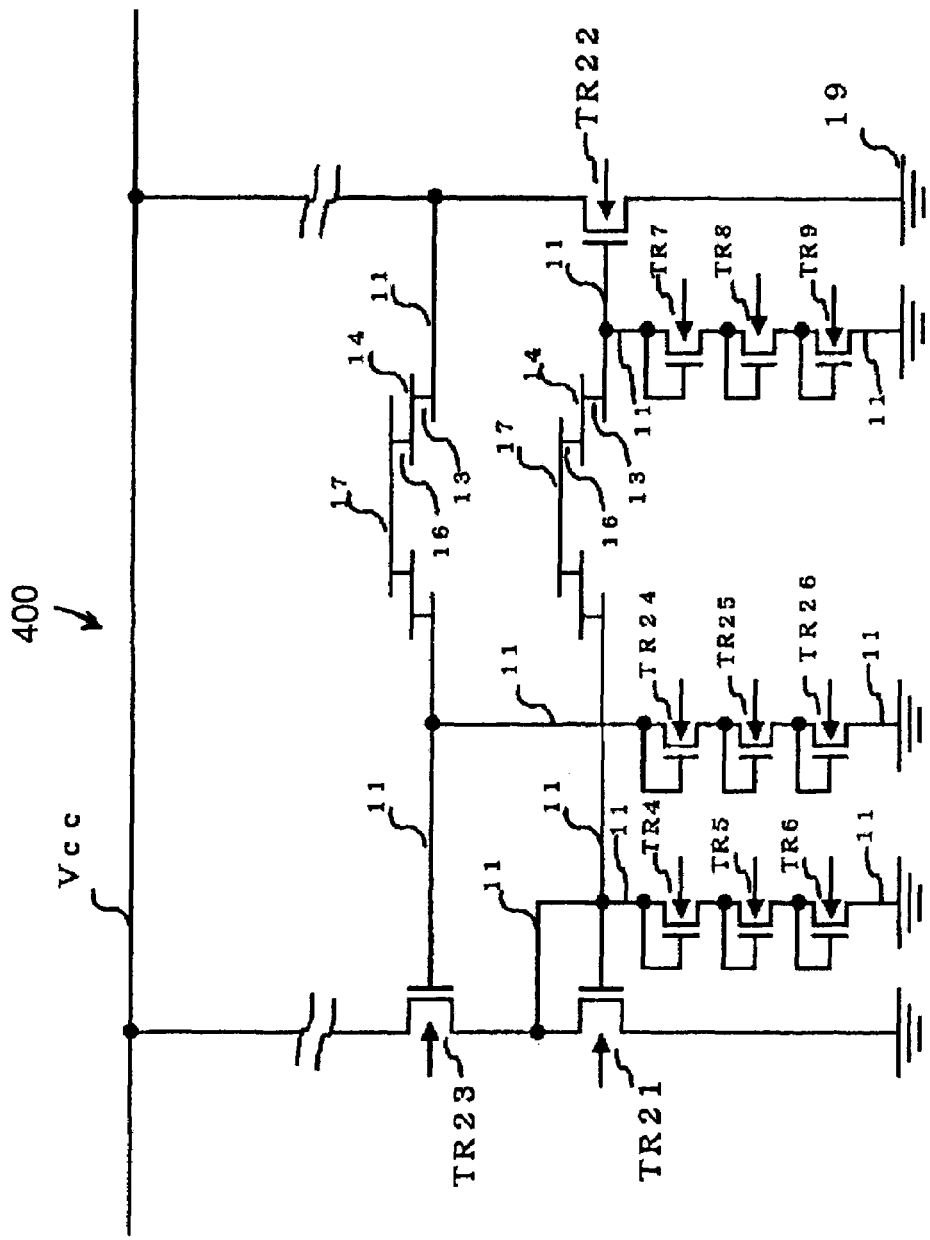
FIG. 5 is a circuit diagram illustrating a Wilson constant current circuit in accordance with an embodiment of the present invention.

FIG. 5 illustrates a circuit configuration of a Wilson constant current circuit in another embodiment of a semiconductor integrated circuit in accordance with the present invention. A Wilson constant current circuit 400 comprises two Nch MOS transistors TR21 and TR22, with the gates of the transistors being coupled to each other, and one Nch MOS transistor TR23 coupled between the drain of the Nch MOS transistor TR21 and a power source Vcc. Between each gate of Nch MOS transistors TR21 and TR22 and the ground 19, a respective protection unit is provided. The protection units comprise a plurality of transistors TR4-TR6 or a plurality of transistors TR7-TR9 coupled as a cascade. Further, the gate of the Nch MOS transistor TR23 is coupled to the ground 19 through a third element that comprises a plurality of gate-drain connected Nch MOS transistors TR24-TR26 coupled as a cascade.

The drain of the Nch MOS transistor TR21 is coupled to the source of the Nch MOS transistor TR23 and the gate of the Nch MOS transistor TR23 is coupled to both the drain of the Nch MOS transistor TR22 and the power source Vcc. When a reference current flows in the Nch MOS transistor TR22, the Nch MOS transistors TR23 and TR21 generate a constant output current which is independent of the drain voltage of the Nch MOS transistor TR21. The first wiring layer 11 is coupled between the gate of the Nch MOS transistor TR23 and the drain of the gate-drain connected Nch MOS transistor TR24. The first wiring layer 11 also connects between the gate and the drain of the gate-drain connected Nch MOS transistors TR24-TR26. Further, the first wiring layer 11 is coupled between the ground 19 and the source of the gate-drain connected Nch MOS transistor TR26. The gate of the Nch MOS transistor TR23 is coupled to both the source of the Nch MOS transistor TR22 and the power source Vcc through a first via 13, a second wiring layer 14, a second via 16 and a third wiring layer 17. Thus, each group of gate-drain connected Nch MOS transistor groups TR4-TR6, TR7-TR9 and TR24-TR26 operates as a protection element for the respective Nch MOS transistors TR21, TR22 and TR23.

If minus (−) charge is generated during the plasma process, the PN junctions of the gate-drain connected Nch MOS transistors TR4, TR7 and TR24 becomes biased in a forward direction so as to discharge the minus charge to the ground 19. If plus (+) charge is generated, a threshold voltage (Vth) is sequentially supplied to each gate and drain of the protection elements of the gate-drain connected Nch MOS transistor groups TR4-TR6, TR7-TR9 and TR24-TR26. Thus, each transistor in each group sequentially changes to an "ON" state and discharges the generated plus charge to the ground. Accordingly, it becomes possible to prevent gate insulating films from degrading or having dielectric breakdown due to charges generated during multi-region wiring processes, in particular, a plasma etching opening process of a via by the R1E and reverse sputtering processes of wiring metals.

Figure 6:
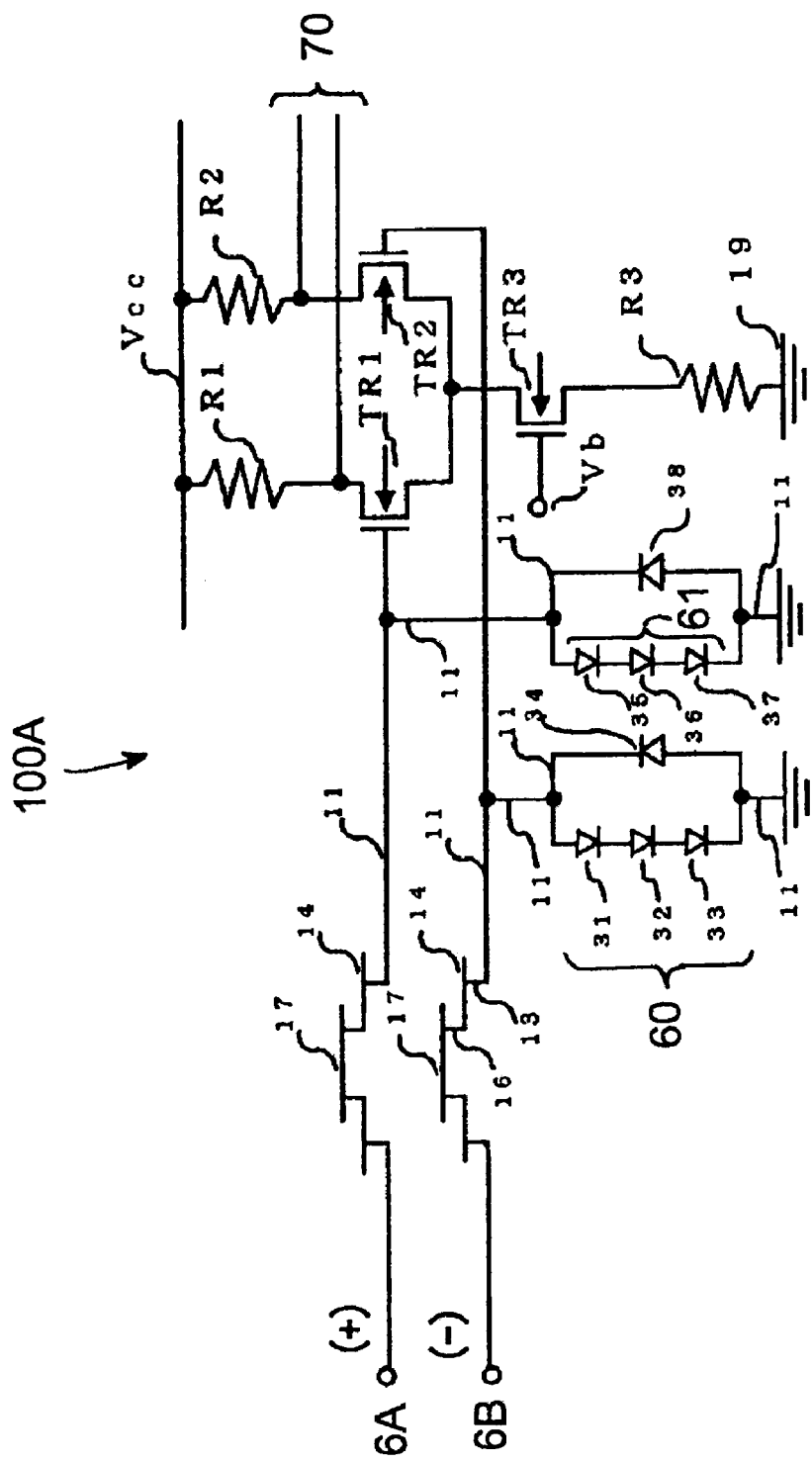
FIG. 6 is a circuit diagram illustrating a differential amplifier in accordance with another embodiment of the present invention.

FIG. 6 is a circuit configuration of a differential amplifying circuit which is illustrated as another embodiment of a semiconductor integrated circuit explained in FIG. 1. The differential amplifying circuit 100A comprises an Nch MOS transistor that uses a SOI substrate. The same configurations shown in FIG. 1 are indicated by the same numbers. The differential amplifying circuit 100A includes first and second protection elements 60 and 61 for the respective Nch MOS transistors TR2 and TR1. The first protection element 60 comprises a first diode group 60 of a plurality diodes 31-33 coupled as a cascade and a first diode 34 provided in parallel to the first diode group 60 so as to operate in a reverse direction of the first cascade diode group. Similarly, the second protection element 61 comprises a second diode group 61 of a plurality diodes 35-37 coupled as a cascade and a second diode 38 provided in parallel to the first diode group 60 so as to operate in a reverse direction of the first cascade diode group. Each of the first and second diode groups 60 and 61 is coupled between the gate of the respective Nch MOS transistors TR1 and TR2 and the ground 19. A first wiring 11 is coupled among the diodes 31-38.

Figure 7:
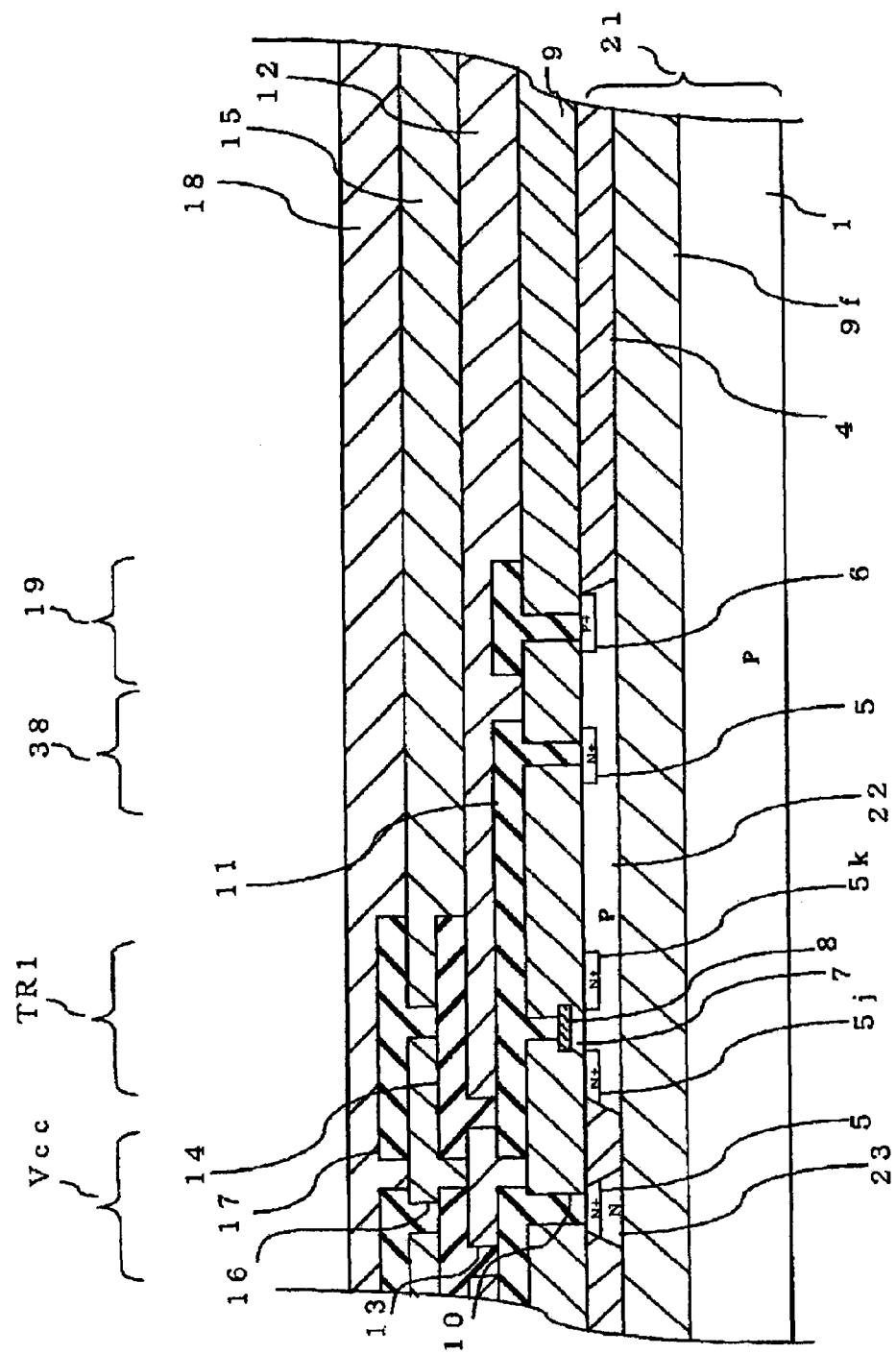
FIG. 7 is a cross-sectional view illustrating an embodiment of the differential amplifier shown in FIG. 6.

FIG. 7 is a cross-sectional view of the Nch MOS transistor TR1 and the diode 38 of the differential amplifying circuit 100A shown in FIG. 6. Both the Nch MOS transistor TR3 and the first diode 38 are formed on a SOI substrate 21 including P type silicon substrate 1 of a high resistor. An insulating film 9f is provided on the high resistor P type silicon substrate 1 and a silicon thin film provided on the insulating film 9f. The Nch MOS transistor TR1 and diode 38 are provided on a P type film 22 of the silicon thin film that is separated by a surrounding embedded insulating film 4. On a surface of the P type film 22, an N+ drain region 5j, an N+ source region 5k, an N+ region 5 and a P+ region 6 are formed. The P+ region 6 is used as the ground 19 of the differential amplifying circuit 10A. The N+ region 5 formed on an N type region 23 that is separated by surrounding the embedded insulating film 4 is used as a power source Vcc of the differential amplifying circuit 100A. An exposed gate electrode 8 of the Nch MOS transistor TR1 and an exposed N+ region 5 of diode 38 are coupled through a first wiring 11.

A first wiring 11 is coupled between a gate of the Nch MOS transistor TR1 and one input (+) 6A of differential input terminals. The first wiring 11 further is coupled between the gate of the Nch MOS transistor TR2 and the other input (−) 6B of differential input terminals. The first wiring 11 is coupled between both diodes 31 and 34 and the gate of the Nch MOS transistor TR2, and also is coupled between both diodes 35 and 38 and gate of Nch MOS transistor TR1. Further, the first wiring 11 is coupled between each of the first and second diode groups 60 and 61 and the ground 19. The Nch MOS transistor TR1 and one input terminal 6A and also the Nch MOS transistor TR2 and the other input terminal 6B are each coupled through a first via 12, a second wiring layer 14, a second via 16 and a third wiring layer 17, and the first wiring 11.

If minus (−) charge is generated during a plasma process, a PN junction of the first diode 38 becomes biased in a forward direction and has a forward direction voltage (Vf). Thus, the first diode 38 operates so as to discharge the minus charge to the P type region 22. On the contrary, if plus (+) charge is generated during the plasma process, PN junctions of the first cascade group of diodes 35-37 becomes biased in a forward direction and discharge the plus charge to the ground since the forward direction voltage (Vf) is supplied to each diodes 35-37 to discharge the plus charge to P type region 22. Similarly, both minus and plus charges are discharged to P type region 22 for protecting Nch MOS transistor TR22. Thus, it becomes possible to prevent the gate insulating film 7 from degrading or having dielectric breakdown due to charges generated during multi-film wiring processes.

Relationships among the maximum voltage (Vsmax) of input signal to Nch MOS transistors TR1 and TR2, a total forward direction voltage (Vft) of the first and second diode groups 60 and 61 and a PN junction breakdown voltage (Vbk) between the N+ region 5 and P type region 22 are explained. The total forward direction (Vft) is represented by the following equation (3).

$$Vft = n \times Vf \quad (3)$$

Here, n is a stage number of cascade connection of diode in a forward direction. Thus, in this embodiment, n=3.

Relationships among the maximum voltage (Vsmax), the total forward direction voltage (Vft) and the PN junction breakdown voltage (Vbk) is represented as follow.

$$0 < Vsmax < Vft < Vbk \quad (4)$$

To operate as a protection element, the stage number of the cascade connection at the forward direction of each diode groups 60 and 61 may simply satisfy a condition that it is lower than PN junction breakdown voltage (Vbk) and is higher than maximum voltage (Vsmax). It is desirable that the total forward direction voltage (Vft) is set up at a lower voltage than each gate breakdown voltage for the Nch MOS transistors TR1 and TR2. Accordingly, it becomes possible to restrain characteristic degradation and reduction of reliability of the differential amplifying circuit 100A which uses the Nch MOS transistors TR1 and TR2 as a differential input pair.

Figure 8:
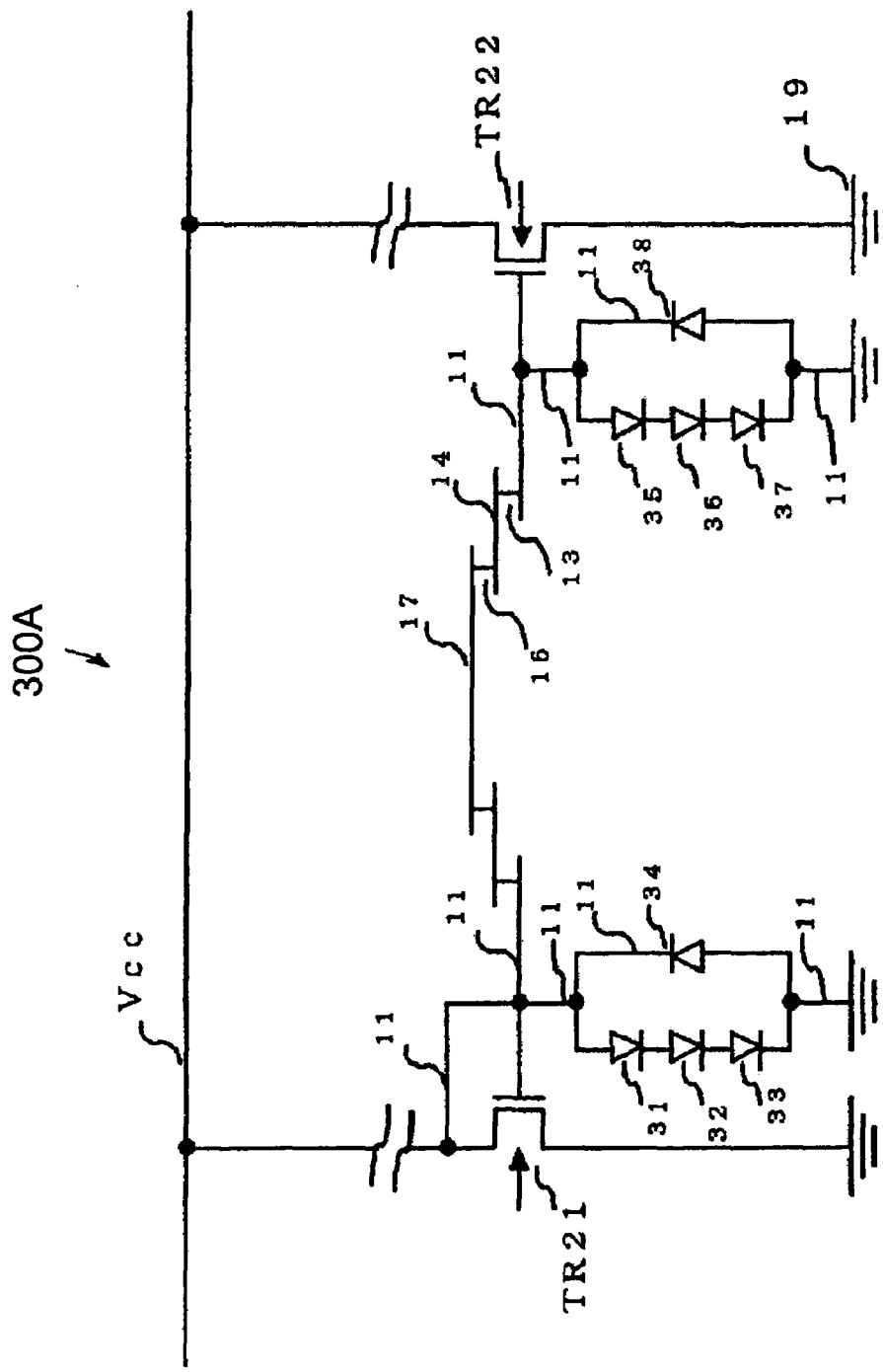
FIG. 8 is a circuit diagram illustrating another embodiment of a current mirror constant current circuit in accordance with the present invention.

FIG. 8 is a circuit configuration of a current mirror constant current circuit as another example of a semiconductor integrated circuit explained in FIG. 4. The current mirror constant current circuit comprises Nch MOS transistors using SOI substrate. The same components shown in FIG. 4 are indicated by the same numbers. The current mirror constant current circuit 300A includes first and second diode protection elements coupled to each gate of the Nch MOS transistors TR21 and TR22. As similar to the configuration shown in FIG. 6, the first protection element comprises a first diode group 60 of a plurality of diodes 31-33 coupled as a cascade and a first diode 34 provided in parallel to the first diode group 60 so as to operate in a reverse direction of the first cascade diode group. The second protection element 61 comprises a second diode group 61 of a plurality of diodes 35-37 coupled as a cascade and a second diode 38 provided in parallel to the first diode group 60 so as to operate in a reverse direction of the first cascade diode group. All wirings are provided as the same of the embodiment as explained in FIG. 4. Thus, the first and second groups of diodes 31-34 and 35-38 are operate as protection elements for the Nch MOS transistors TR21 and TR22.

If a minus (−) charge is generated during the plasma process, PN junctions of the diodes 34 and 38 become biased in a forward direction and a voltage corresponding to the forward direction voltage (Vf) is supplied so as to discharge the minus charge to the ground 19. If a plus (+) charge is generated using the plasma process, PN junctions for the second group of diodes 35-37 coupled as a cascade between the gate of the Nch MOS transistor TR1 and the ground 19 become a forward direction. The forward direction voltage (Vf) is supplied to each diodes 35-37 in order to discharge the generated plus charge to the ground 19. Thus, the current mirror constant current circuit 300A comprising Nch MOS transistors TR21 and TR22 of this embodiment in accordance with this invention can restrain characteristic degradation and reduction of reliability of the semiconductor integrated circuit.

Figure 9:
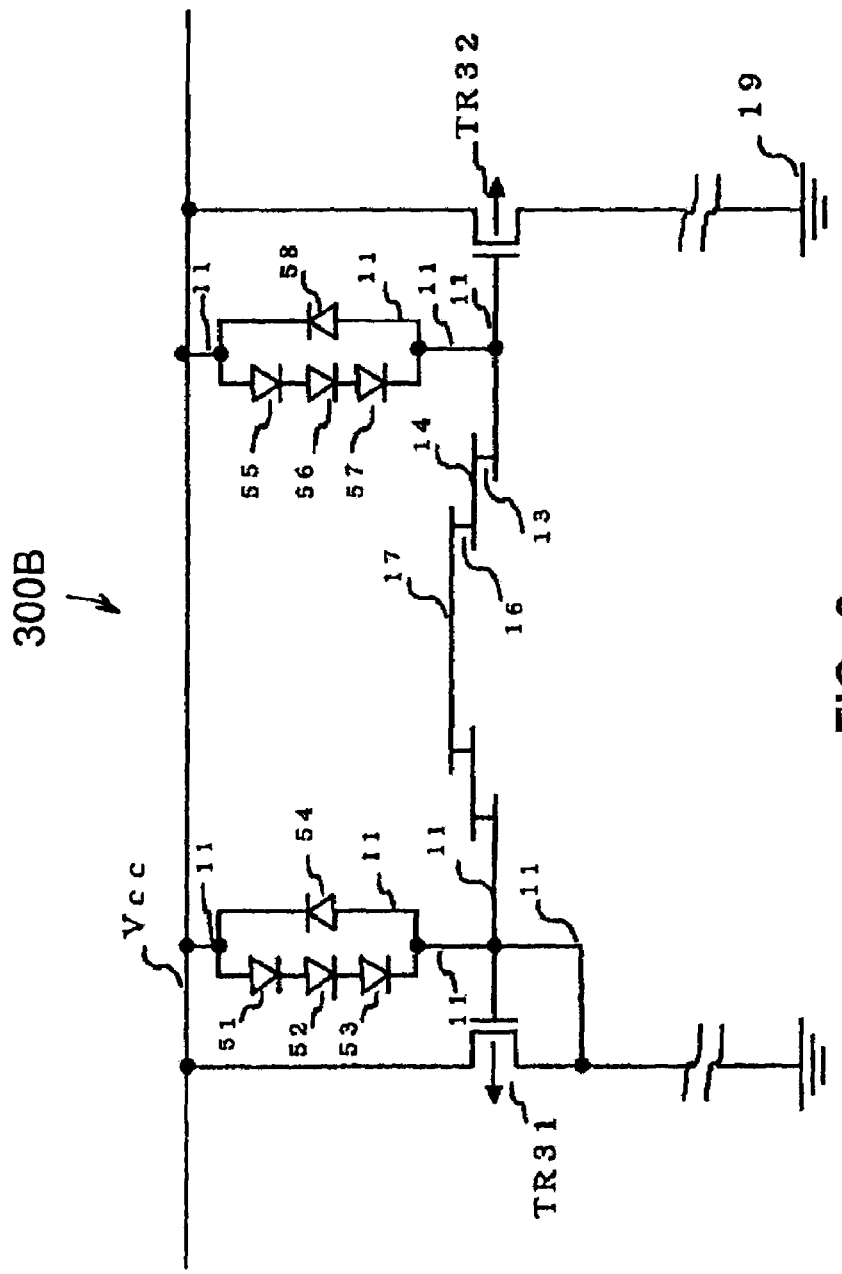
FIG. 9 is a circuit diagram illustrating a further embodiment of a current mirror constant current circuit in accordance with the present invention.
Figure 10:
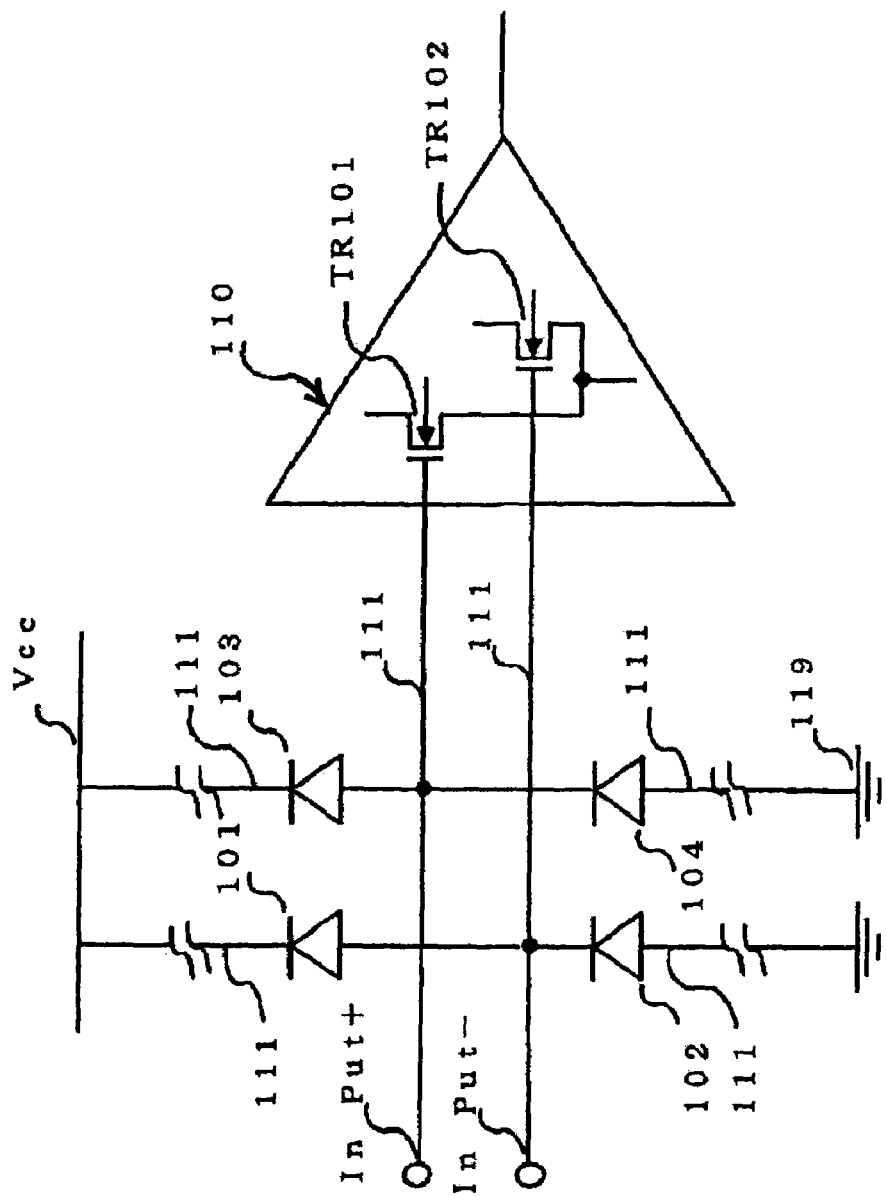
FIG. 10 is a circuit diagram illustrating an operational amplifier having conventional protection elements.
Figure 11:
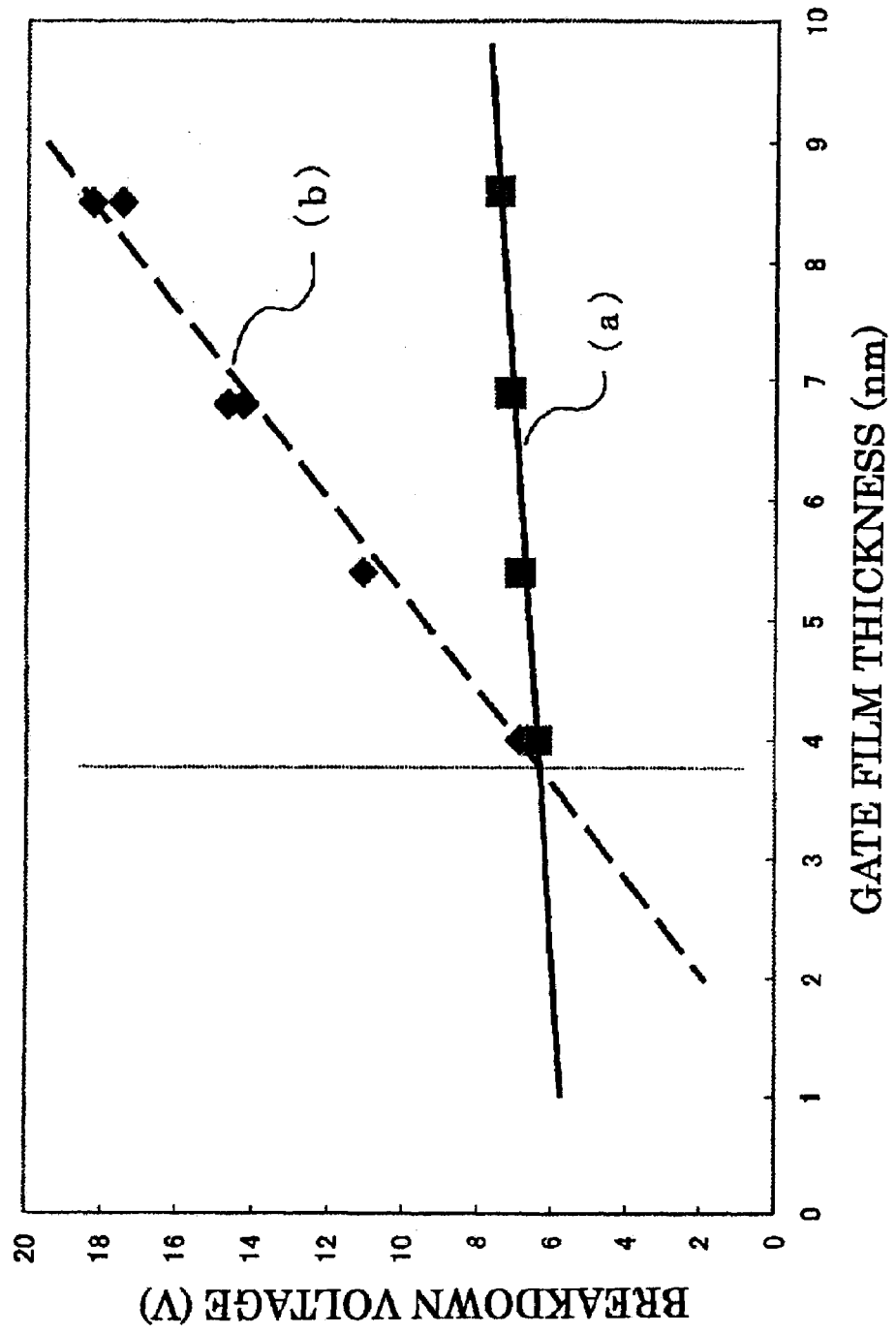
FIG. 11 is a graph showing conventional relationships between a gate thickness and a gate breakdown voltage.

FIG. 9 is a circuit diagram of a current mirror constant current circuit 300B that uses a SOI substrate. This shows another embodiment a of semiconductor integrated circuit in accordance with the present invention. To simplify the explanation, the same numbers in FIG. 8 are used in this embodiment. The current mirror constant current circuit 300B comprises two Pch MOS transistors TR31 and TR32. A first plurality of the diodes 51-53 are coupled as a cascade between the gate of the Pch MOS transistor TR31 and the power source Vcc. A first diode 54 is coupled in parallel and a reverse direction of the cascade of the diodes 51-53. Similarly, a second plurality of diodes 55-57 are coupled as a cascade between the gate of the Pch MOS transistor TR32 and the power source Vcc. A second diode 58 is coupled in parallel and a reverse direction of the plurality of diodes 55-57. All wirings for the diodes 51-58 are formed by a first wiring 11. Each group of diodes 51-54 and diodes 55-58 operates as a protection element for each of the Pch MOS transistors TR31 and TR32, respectively.

A first wiring layer 11 is coupled between a gate and a drain of Pch MOS transistor TR31 and diodes 51-54. Also the first wiring layer 11 is coupled between diodes 51-54 and the power source Vcc. Similarly, the first wiring layer 11 is coupled between a gate of the Pch MOS transistor TR32 and diode 58, and also is coupled between the diodes 55-58 and the power source Vcc. Both gates of the respective Pch MOS transistors TR31 and TR32 are coupled through a first wiring 11, a first via 13, a second wiring layer 14, a second via 16 and a third wiring layer 17. As similar to the previous embodiments, according to the first and second diode protection elements, it becomes possible to prevent a gate insulating film from degrading or dielectric breaking down due to charges generated during multi-layer wiring processes, in particular, in a plasma etching opening process of via by R1E or in a reverse sputtering process of wiring metals.

If a plus (+) charge is generated during a plasma process, each PN junction of diodes 54 and 58 becomes biased in a forward direction and a voltage corresponding to the forward direction voltage (Vf) is supplied so as that the plus charge is discharged to a N type film on which the power source Vcc is provided. If a minus (−) charge is generated during a plasma process, each PN junction of the diodes 55 to 57 that are coupled as a cascade between a gate of Pch MOS transistor TR3 and the power source Vcc, becomes biased in a forward direction and a voltage corresponding to the forward direction voltage (Vf) is supplied so as that the minus charge is discharged to a N type region on which the power source Vcc is provided. According to the semiconductor integrated circuit in accordance with this embodiment, it becomes possible to restrain the reductions of characteristic degradation and reliability of current mirror constant current circuit 300B that comprises the Pch MOS transistors TR31 and TR32.

The present invention is not limited to the embodiments as explained above, but can be performed various configurations. For example, in the above explained semiconductor integrated circuit, a MOS transistor comprises a silicon oxide film (SiO2) as a gate insulating film. The invention is applicable to a semiconductor integrated circuit in which MOS transistor a high dielectric film is used as a gate insulating film. As such high dielectric film, oxide of halfnium (Hf), zirconium (Zr) or lantanium (La), or silicate of them, for example HfSiOn are used.

In the above explained embodiments, gate-drain connected MOS transistors or diodes are provided as protection elements for degradation or dielectric breakdown of gate insulating films due to plasma damage during manufacturing MOS transistors for respectively constructing a differential input pair for a differential amplifying circuit, a current mirror constant current circuit or a Wilson constant current circuit. It is also possible to provide single gate-drain connected MOS transistor or single diode which is required to perform a high accuracy analog operation. In the embodiments illustrated in FIGS. 6, 8 and 9, the semiconductor integrated circuit uses a SOI substrate. Of course, the invention is applicable to a semiconductor integrated circuit using a silicon substrate. In the embodiments illustrated in FIGS. 1, 3 and 6, it has been explained as a differential amplifying circuit in which two MOS transistors TR1 and TR2 are used as a differential input pair. Of course, it is applicable to another circuit which uses two MOS transistors as a differential input pair, for example, a mixer circuit.

Other embodiments of the invention will be apparent to those skilled in the art from consideration of the specification and practice of the invention disclosed herein. It is intended that the specification and examples be considered as exemplary only, with a true scope and sprit of the invention being indicated by the following claims.

What is claimed is:
1. A semiconductor integrated circuit comprising:
first and second input terminals;
a first transistor configured to conduct in response to a first input signal being supplied to a gate of the first transistor through the first input terminal;
a second transistor configured to conduct in response to a second input signal being supplied to a gate of the second transistor through the second input terminal;
a first protection element coupled between a gate of the first transistor and the ground or between a gate of the first transistor and a power source line so as to discharge minus or plus charge generated during manufacturing of the semiconductor integrated circuit to the ground or the power source line by operating at a lower voltage than a PN junction breakdown voltage, the first protection element including a plurality of gate-drain connected MOS transistors coupled as a cascade; and
a second protection element coupled between a gate of the second transistor and the ground or between a gate of the second transistor and a power source line so as to discharge minus or plus charge generated during manufacturing of the semiconductor integrated circuit to the ground or the source line by operating at a lower voltage than a PN junction breakdown voltage, the second protection element including a plurality of gate-drain connected MOS transistors coupled as a cascade,
wherein a source and drain of the respective first and second transistors are coupled to one of the ground and the power source, respectively, and the drain and source of the respective first and second transistors are coupled to the other of the ground and the power source, respectively, so as to constitute a differential amplifier, and
wherein each of the first and second input terminals is coupled to the gate of the respective first and second transistors and each of the respective first and second protection elements through a wiring layer adjoined to the ground or the power source line.

2. The semiconductor integrated circuit of claim 1, wherein the first and second transistors and the gate-drain connected transistors are n-channel MOS transistors.

3. The semiconductor integrated circuit of claim 1, wherein the first and second transistors and the gate-drain connected transistors are p-channel MOS transistors.

4. The semiconductor integrated circuit of claim 1, wherein the number of the plurality of gate-drain connected MOS transistors coupled as the cascade in the first protection element is equal to that of the plurality of gate-drain connected MOS transistors coupled as the cascade in the second protection element.

5. A semiconductor integrated circuit comprising:
first and second input terminals;
a first transistor configured to conduct in response to a first input signal being supplied to a gate of the first transistor through the first input terminal;
a second transistor configured to conduct in response to a second input signal being supplied to a gate of the second transistor through the second input terminal;
a first protection element coupled between the gate of the first transistor and the ground or between the gate of the first transistor and a power source line so as to discharge minus or plus charge generated during manufacturing of the semiconductor integrated circuit to the ground or the power source line by operating at a lower voltage than a PN junction breakdown voltage, the first protection element including a plurality of diodes coupled in series and a diode provided in parallel to the plurality of first diodes in a reverse direction; and
a second protection element coupled between the gate of the second transistor and the ground or between the gate of the second transistor and a power source line so as to discharge minus or plus charge generated during manufacturing of the semiconductor integrated circuit to the ground or the power source line by operating at a lower voltage than a PN junction breakdown voltage, the second protection element including a plurality of diodes coupled in series and a diode provided in parallel to the plurality of third diodes in a reverse direction, wherein a source and drain of the respective first and second transistors are coupled to one of the ground and the power source, respectively, and the drain and source of the respective first and second transistors are coupled to the other of the ground and the power source respectively, so as to constitute a differential amplifier, and wherein each of the first and second input terminals is coupled to the gate of the respective first and second transistors and each of the respective first and second protection elements through a wiring layer adjoined to the ground or the power source line.

6. The semiconductor integrated circuit of claim 5, wherein the first and second transistors are n-channel MOS transistors.

7. The semiconductor integrated circuit of claim 5, wherein the first and second transistors are p-channel MOS transistors.

8. The semiconductor integrated circuit of claim 5, wherein the number of the plurality of first diodes coupled in series in the first protection element is equal to that of the plurality of diodes coupled in series in the second protection element.

9. A semiconductor integrated circuit comprising:
a first transistor, a gate of the first transistor is connected to the drain of the first transistor, the drain of the first transistor is coupled to a power source line and a source of the first transistor is coupled to a ground;
a second transistor, a drain of the second transistor is coupled to the power source line, and a source of the second transistor is coupled to the ground;
a first protection element coupled between the gate of the first transistor and the ground or the power source line in order to discharge charges generated during manufacturing of the semiconductor integrated circuit to the ground or the power source line by operating at a lower voltage than a PN junction breakdown voltage; and
a second protection element coupled between the gate of the second transistor and the ground or the power source line in order to discharge charges generated during manufacturing the semiconductor integrated circuit to the ground or the power source line by operating at a lower voltage than a PN junction breakdown voltage,
wherein each gate of the first and second transistors and each of the first and second protection elements is coupled to the ground or the power source line through a wiring layer.

10. The semiconductor integrated circuit of claim 9, wherein each of the first and second protection elements includes a plurality of gate-drain connected MOS transistors coupled as a cascade, the number of the plurality of gate-drain connected MOS transistors coupled as the cascade in the first protection element is equal to that of the plurality of gate-drain or gate-source connected MOS transistors coupled as the cascade in the second protection element.

11. The semiconductor integrated circuit of claim 9, wherein each of the first and second protection elements includes a plurality of diodes coupled in series, the number of the plurality of diodes coupled in series in the first protection element is equal to that of the plurality of diodes coupled in series in the second protection element.

* * * * *